(12) United States Patent  
Hobbs et al.

(10) Patent No.: US 8,183,104 B2  
(45) Date of Patent: May 22, 2012

(54) METHOD FOR DUAL-CHANNEL NANOWIRE FET DEVICE

(76) Inventors: Christopher C. Hobbs, Clifton Park, NY (US); Kerem Akarvardar, Albany, NY (US); Injo Ok, Watervliet, NY (US)

( * ) Notice: Subject to any disclaimer, the term of this patent is extended or adjusted under 35 U.S.C. 154(b) by 0 days.

(21) Appl. No.: 12/831,839

(22) Filed: Jul. 7, 2010

(65) Prior Publication Data  
US 2012/0007052 A1    Jan. 12, 2012

(51) Int. Cl.  
*H01L 21/8238* (2006.01)

(52) U.S. Cl. ............ 438/199; 438/275; 257/E29.245

(58) Field of Classification Search ............ 438/142, 438/199, 275, 283, 285; 257/24, 365–366, 257/E29.245, E29.255  
See application file for complete search history.

(56) References Cited

U.S. PATENT DOCUMENTS

2010/0187503 A1* 7/2010 Moriyama et al. .............. 257/24  
* cited by examiner

*Primary Examiner* — Tucker Wright  
(74) *Attorney, Agent, or Firm* — Fulbright & Jaworski L.L.P.

(57) ABSTRACT

An apparatus, system, and method for dual-channel FET devices is presented. In some embodiments, the nanowire FET device may include a first transistor on a substrate, where the first transistor includes a first group of nanowires made of silicon. The nanowire FET device may also include a second transistor on the same substrate, where the second transistor includes a second group of nanowires made of silicon-germanium.

15 Claims, 12 Drawing Sheets

METHOD FOR DUAL-CHANNEL NANOWIRE FET DEVICE

BACKGROUND OF THE INVENTION

1. Field of the Invention

This invention relates to dual-channel nanowire FET devices and more particularly relates to an apparatus, system, and method for dual-channel nanowire integration.

2. Description of the Related Art

Metal-Oxide-Semiconductor Field Effect Transistors (MOSFETs) are widely used for amplifying or switching electronic signals. A typical MOSFET has a substrate with a source and drain region doped into the substrate. A gate stack, which includes an insulator and a metal (or polysilicon) is then placed on the substrate between the source and drain. The area of the substrate between the source and drain is sometimes referred to as the depletion region.

Advances in technology have allowed the MOSFET to become smaller, faster, have lower leakage current, and have lower output resistance. As a conventional planar MOSFETs are scaled down, it becomes more difficult to control the channel in these devices because they have shorter gate lengths. One advance to enable further MOSFET scaling has been to use nanowires as the semiconductor channel. Nanowires have the advantage of having a gatestack that wraps around the channel. This, in part, improves the performance by enabling devices with short gate lengths to have better control of the channel than a conventional planar device. Some nanowire FETs have been manufactured by having stacked nanowires. Multiple nanowires help increase the current capacity of the FET device.

SUMMARY OF THE INVENTION

An method of fabricating a nanowire FET (field effect transistor) device is presented. In one embodiment, the method includes depositing, in at least two alternating layers, a first semiconductor material and a second semiconductor material to form a semiconductor structure. The semiconductor structure may include a buried oxide layer and may have other layers between the alternating layers of the first semiconductor material and the second semiconductor material.

In some embodiments, the method includes etching a first layered column and a second layered column in the semiconductor structure. In some embodiments, the method may include forming a first group of nanowires, where the first group of nanowires may include the first semiconductor material from the first layered column. In some embodiments, the method may include forming a second group of nanowires, where the second group of nanowires may include the second semiconductor material from the second layered column.

In some embodiments, the method includes depositing a first gate coupled to the first group of nanowires. In some embodiments, the method may include depositing a second gate coupled to the second group of nanowires. In some embodiments, the first gate and the second gate may be coupled together. In some embodiments, the first gate and the second gate are formed simultaneously using the same deposition process and the same etch process. The first gate and the second gate may be made of the same material.

In some embodiments, the step of etching the first and second layered columns may include depositing a first mask layer on the semiconductor structure, where the first mask layer comprises a pattern for the first and second layered columns. Additionally, the step of etching the first and second layered columns may include etching the semiconductor structure that is not masked by the first mask layer.

In some embodiments, the step of forming the first group of nanowires may include forming a second mask layer on the second layered column, and etching the second semiconductor material from the first layered column. Additionally, the step of forming the first group of nanowires may include removing the second mask layer.

In some embodiments, the step of forming the second group of nanowires may include forming a third mask layer on the first group of nanowires, and etching the first semiconductor material from the second layered column. Additionally, the step of forming the second group of nanowires may include removing the third mask layer.

In some embodiments, the first semiconductor material may be silicon (Si). In some embodiments, the second semiconductor material may be silicon-germanium (Si—Ge).

In some embodiments, the method of fabricating the nanowire FET device may include etching an insulator below the first layered column such that perimeter of the nanowire is not coupled to the insulator. In some embodiments, the method may include etching the insulator below the second layered column.

In some embodiments, the nanowires may be rounded. This step may include rounding the first group of nanowires, and it may include rounding the second group of nanowires. In some embodiments, the rounding may be accomplished using a hydrogen bake. In some embodiments, the rounding may be accomplished using oxidation. In some embodiments, the step of rounding the first group of nanowires may be different from the step of rounding the second group of nanowires.

In some embodiments, the step of forming a second group of nanowires may include forming a third semiconductor layer coupled to the second semiconductor material. The third semiconductor layer may be a thin layer that is coupled to the second group of nanowires around the circumference of the second group of nanowires.

A nanowire FET device is also presented. In some embodiments, the nanowire FET device includes a substrate, and a first and second transistor. In some embodiments, the first transistor is coupled to the substrate, and the first transistor includes a first group of nanowires and a first gate structure coupled to the first group of nanowires. The first group of nanowires may include a first semiconductor material. In some embodiments, the first transistor may be an nFET. In some embodiments, the second transistor is also on the substrate, and the second transistor includes a second group of nanowires and a second gate structure coupled to the second group of nanowires. The second group of nanowires may include a second semiconductor material. In some embodiments, the second transistor may be a pFET.

In some embodiments, the first semiconductor material may be silicon (Si). The second semiconductor may be silicon-germanium (Si—Ge). In some embodiments, the first semiconductor material may be a III-V material, and the second semiconductor may be germanium (Ge).

In some embodiments, the number nanowires in the first group of nanowires may not be equal to the number nanowires in the second group of nanowires.

An integrated circuit (IC) device is also presented. In some embodiments, the IC device may include a chip package configured to house an IC. The chip package may also have a plurality of electrical interface pins in communication with the IC. The electrical interface pins may be configured to conduct electrical signals. In some embodiments, the IC device may include at least one nanowire FET device disposed within the chip package.

In some embodiments, the nanowire FET device may include a first transistor on a substrate. The first transistor may include a first group of nanowires, and the first group of nanowires may include a first semiconductor material. In some embodiments, the nanowire FET device may include a second transistor on the substrate, and the second transistor may include a second group of nanowires. In some embodiments, the second group of nanowires may include a second semiconductor material.

In some embodiments, the nanowire FET device may include a first gate coupled to the first group of nanowires. The nanowire FET device may also include a second gate coupled to the second group of nanowires.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1:
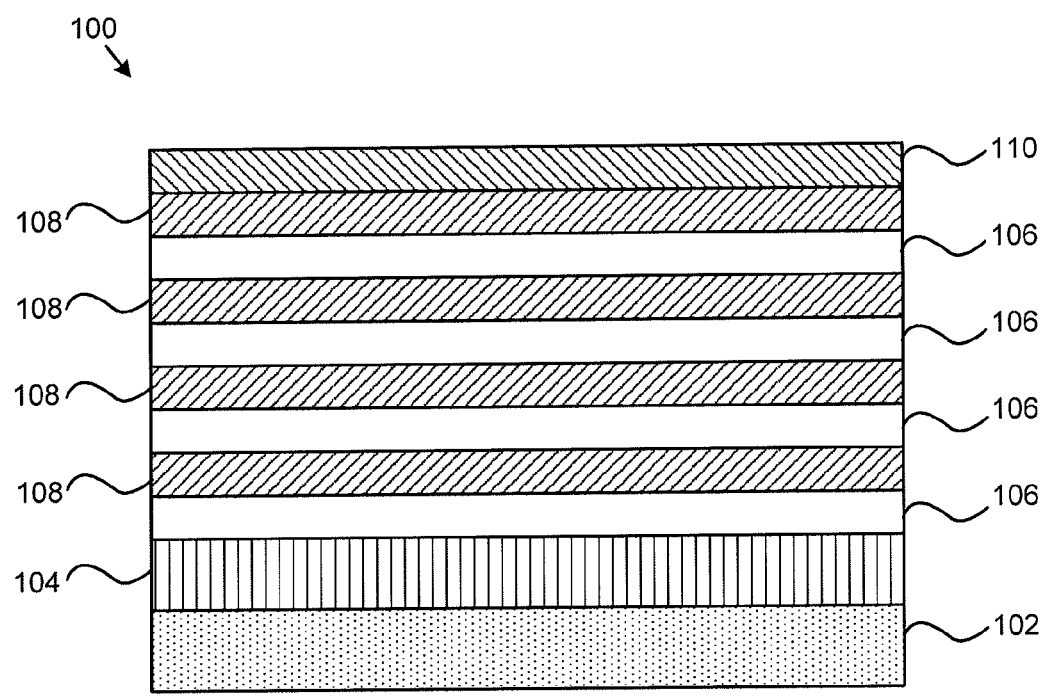
FIG. 1 is a cross sectional view of a semiconductor structure having alternating semiconductor material layers.

FIG. 1 illustrates one embodiment of a layered semiconductor structure 100 for a dual-channel nanowire FET device. In one embodiment, the semiconductor structure 100 includes a substrate 102, which is made of silicon. On top of the substrate 102 is a layer of buried oxide 104 (or BOX). Above the buried oxide layer 104, are alternating layers of two semiconductors. In this embodiment, a first layer of silicon (Si) 106 is on top of the buried oxide layer 104. On top of the first layer of silicon 106 is a layer of silicon germanium (Si—Ge) 108. The alternating layers of Si 106 and Si—Ge 108 repeat until there are four layers of Si 106 and four layers of Si—Ge 108. Some embodiments have may have more or less layers. Some embodiments have only one layer of Si and one layer of Si—Ge. In some embodiments, the number of Si 106 and Si—Ge 108 may not be the same. For example, there may be three layers of Si 106 and four layers of Si—Ge 108. On top of the uppermost Si—Ge 108 layer is a first hardmask layer 110. This layer may be used in photolithography.

Figure 2A:
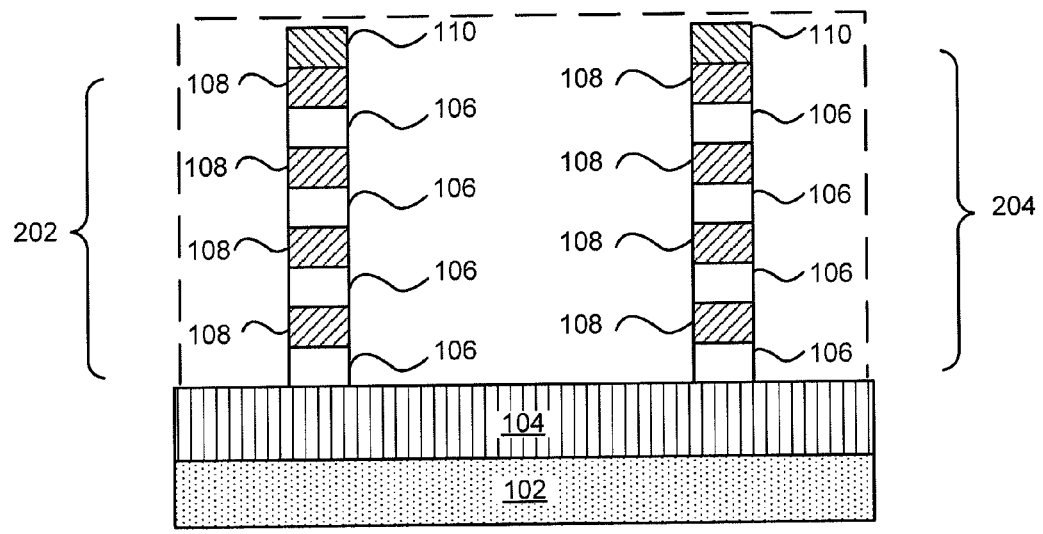
FIG. 2A is a cross sectional view of a semiconductor structure having layered columns etched into the structure.
Figure 2B:
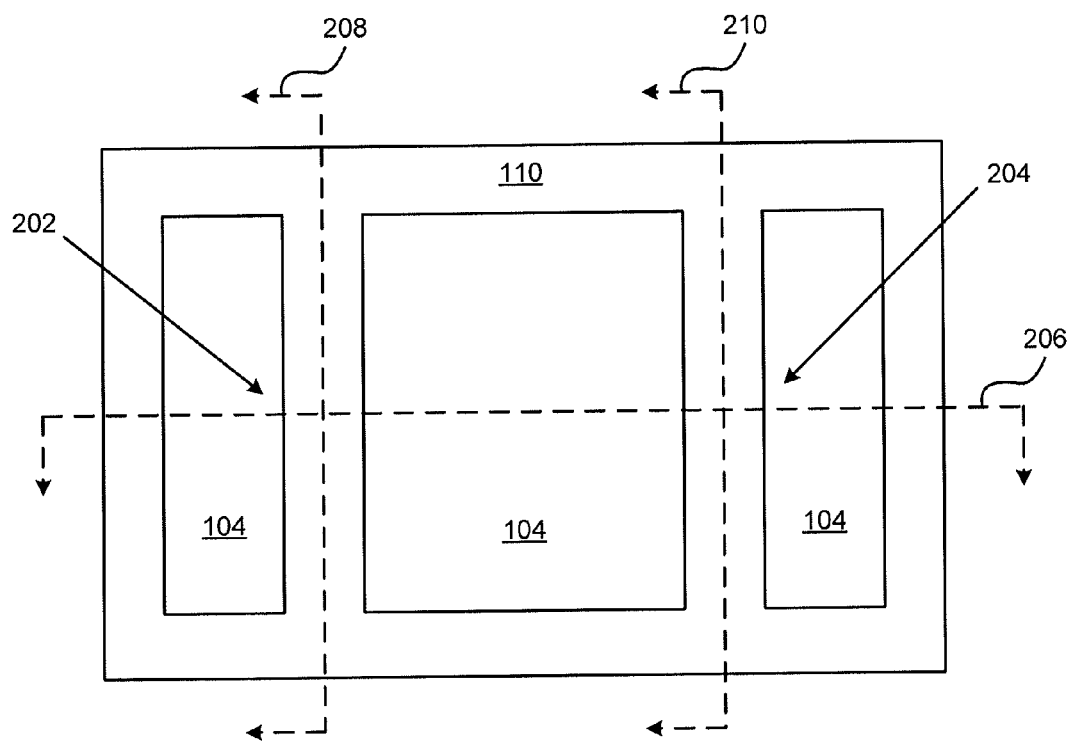
FIG. 2B is a top view of the semiconductor structure having layered columns etched into the semiconductor structure.

FIG. 2A shows a cross section of the layered semiconductor structure 100 after two layered columns have been formed by etching into semiconductor structure. FIG. 2B shows the same structure from a top view. Section line 206 in FIG. 2B shows the cross section depicted in FIG. 2A. As one can see, although FIG. 2A only shows columns, those columns are attached to the rest of the structure at their ends and at the bottom to the buried oxide layer. The first layered column 202 and the second layered column 204 have alternating layers of Si 106 and Si—Ge 108. The columns may be made using a dry etch.

Figure 2C:
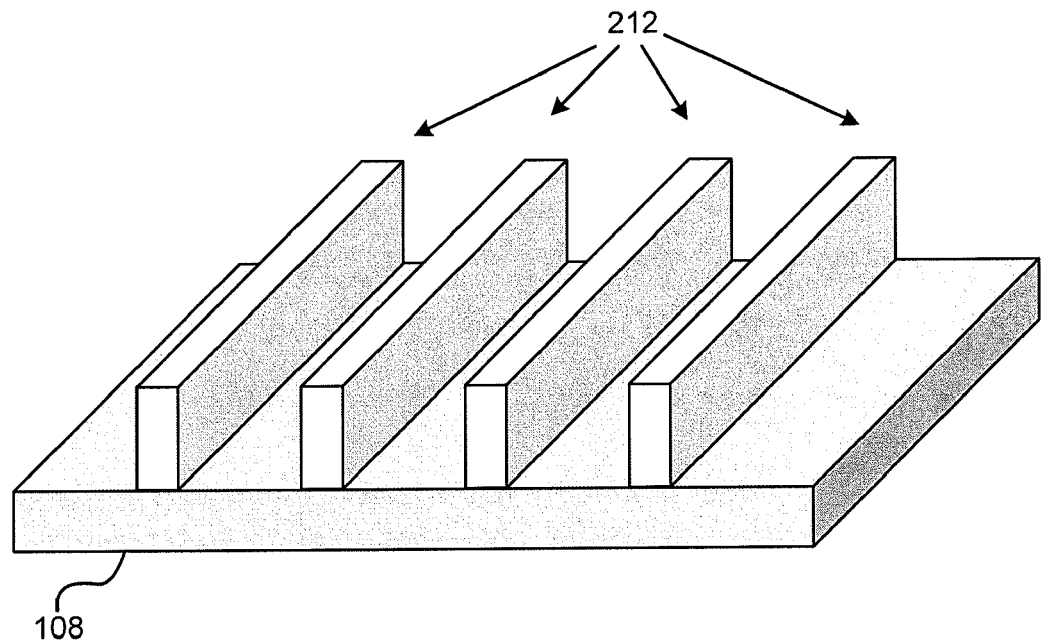
FIG. 2C is a projection view of an array of semiconductor lines.
Figure 2D:
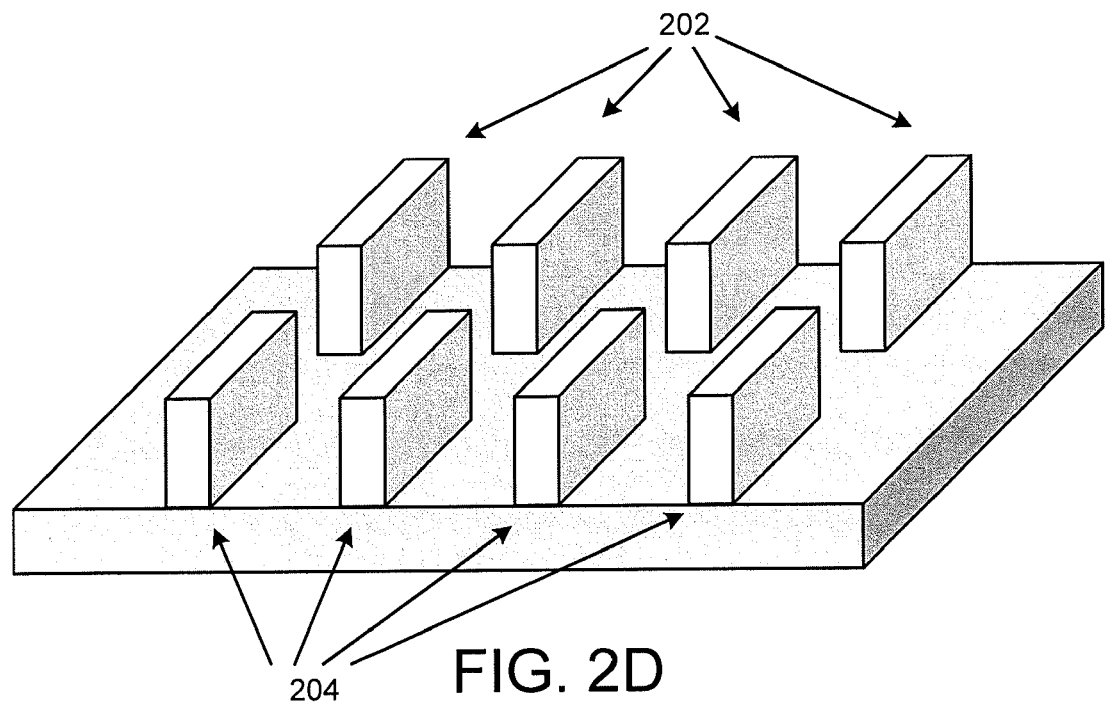
FIG. 2D is a projection view of an array of semiconductor columns.

FIGS. 2C and 2D show projection views of an array of semiconductor columns. In some embodiments, these columns are formed using a double patterning process. First, a mask may be used that creates semiconductor lines 212 as shown in FIG. 2C. Although not shown in this figure, each semiconductor line 212 comprises a stack of alternating semiconductor materials, such as shown in FIG. 2A. Second, the semiconductor lines 212 may be cut using another mask and etch process, leaving an array of first layered columns 202 and second layered columns 204. One advantage of this double patterning process is that multiple nanowire FET devices may be efficiently produced on one substrate 108. Also, nFETs and pFETs may be fabricated in close proximity.

Figure 3:
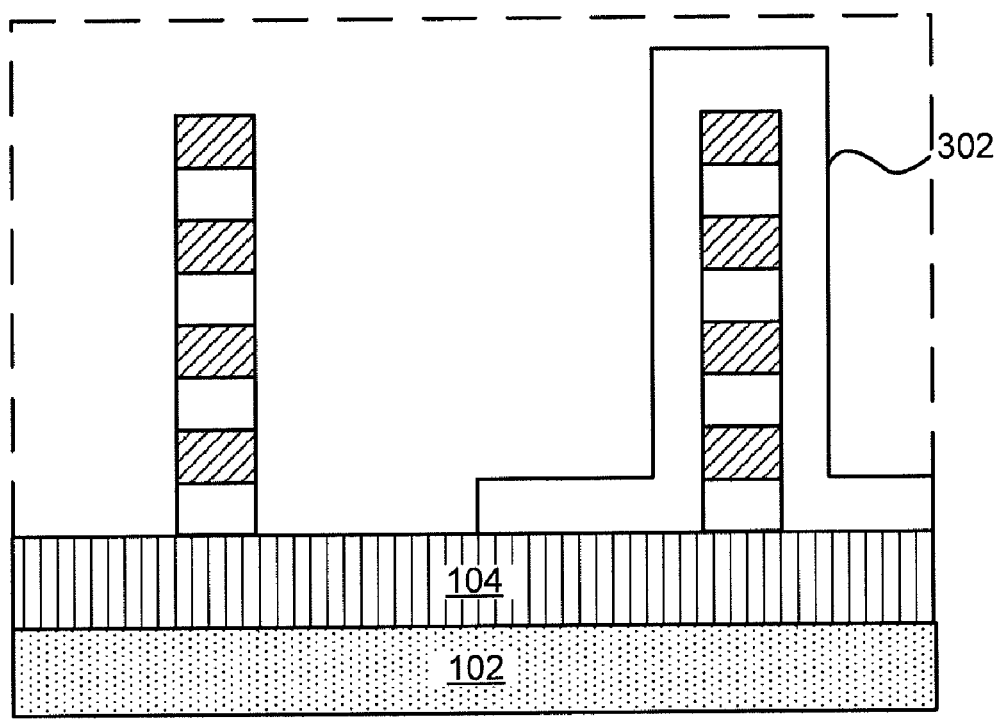
FIG. 3 is a cross sectional view of layered semiconductor columns.

FIG. 3 shows a second mask layer 302 over the second layered column 204. The second mask layer 302 may be silicon dioxide ($SiO_2$). A purpose of the second mask layer 302 may be to cover the second mask layer 302 while processing steps are performed on the first layered column 202.

Figure 4A:
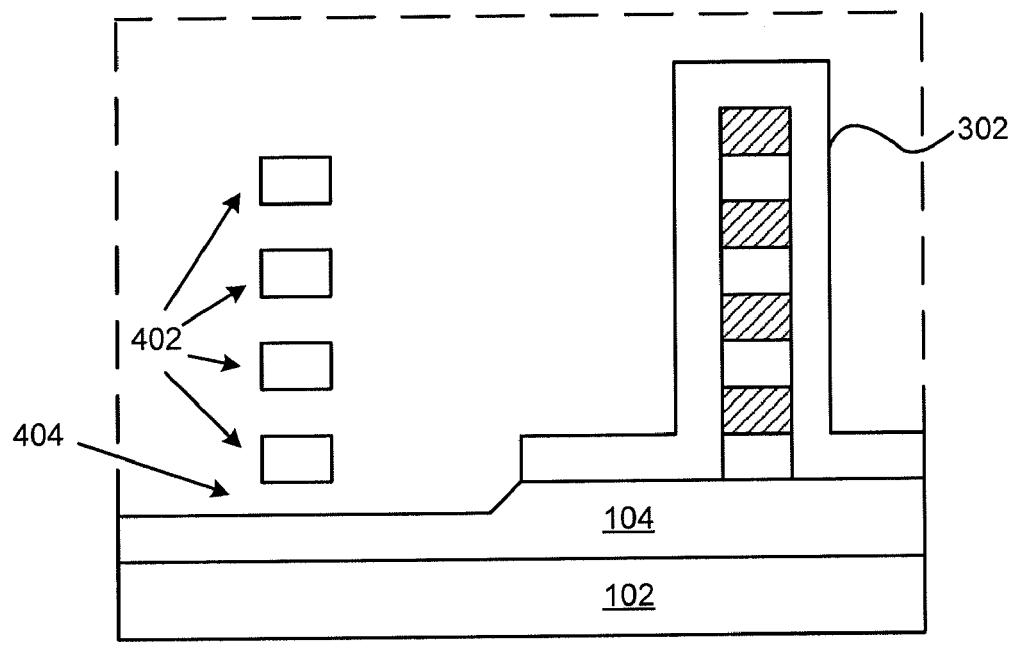
FIG. 4A is a cross sectional view showing a first group of nanowires.

FIG. 4A shows how the first layered column 202 becomes the first group of nanowires 402. In this example, the Si—Ge 108 is selectively etched from the first layered column, leaving the first group of nanowires 402 that are made of the Si 106 that remains. Reported methods for SiGe selective etches use pure $CF_4$ plasma at high pressure in remote plasma systems or HCl vapor at high temperature in RPCVD tools. For Si selective etch, a finely-tuned mixture of CF4/O2/N2 has been shown to be effective. In both cases the selectivity improves significantly with the Ge percentage of the SiGe layer. In some embodiments, the BOX layer 104 may be removed from below the first group of nanowires. In some embodiments, the removed BOX region 404 may be removed before the first group of nanowires 402 are made. One purpose of removing the BOX region from below the first group of nanowires 402 is to expose the bottom side of the lowest nanowire 402. Because the first semiconductor layer 106 is formed directly on the BOX layer, the lowest nanowire 402 may only be exposed around its entire circumference if the BOX layer is removed from below the first group of nanowires 402.

Figure 4B:
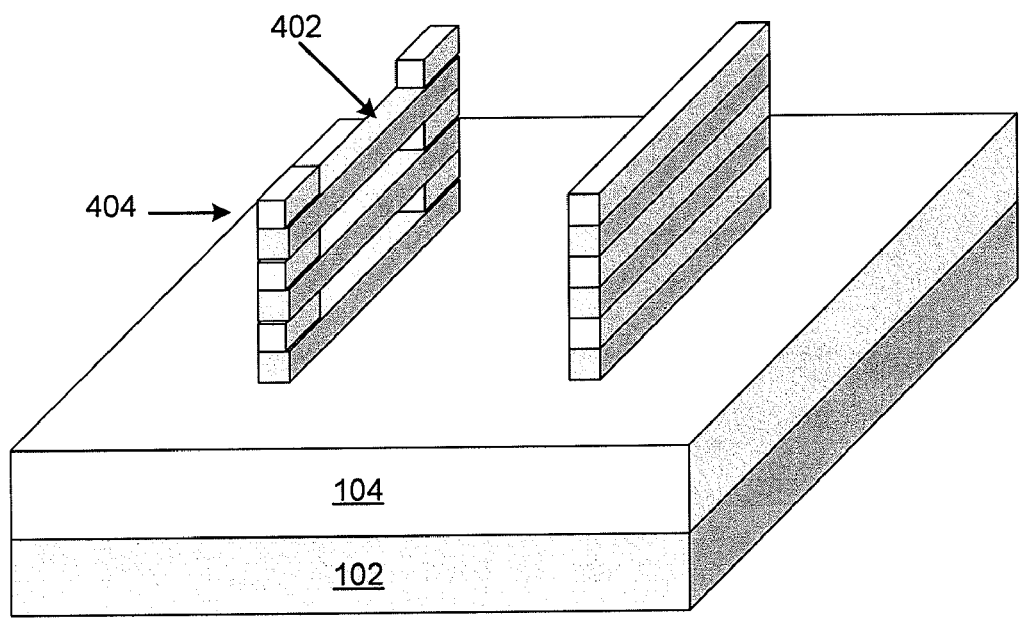
FIG. 4B is a projection view showing the first group of nanowires.

Nanowires 402 appear to not be supported in FIG. 4A. However, the nanowires 402 are anchored on both ends, as shown in FIG. 4B because the Si—Ge 108 is not removed from the ends. This may be accomplished by patterning layer 302 in FIG. 3 so that the ends of the nanowires 402 were covered by layer 302 so that. the Si—Ge is selectively etched from the center region of the first layered column, leaving nanowires 402 supported on both ends by the layered Si 106 and Si—Ge 108.

In some embodiments, the first group of nanowires may be rounded. This rounding may be accomplished using a hydrogen ($H_2$) bake (anneal) or through oxidation. The rounding process can help smooth the surface so that the Si to gate dielectric interface in the final device structure has a lower density of interface traps.

Figure 5:
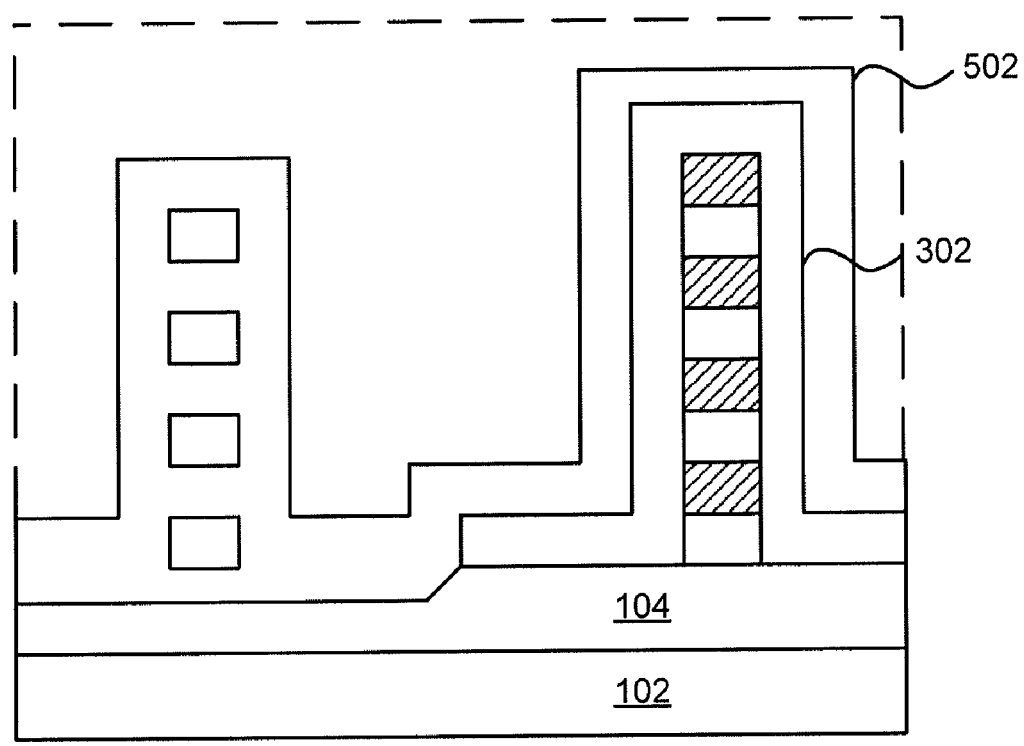
FIG. 5 is a cross sectional view showing a first group of nanowires and a second layered column, where the second layered column is covered by a mask layer.

FIG. 5 shows how a third mask layer 502 is formed over the entire structure. The third mask layer 502 may be $SiO_2$. In some embodiments, the third mask layer 502 may not be necessary. For example, if the nanowires in the first group of nanowires 402 were rounded using oxidation, the oxidation itself may provide enough protection for the first group of nanowire 402 that an additional mask layer may not be necessary.

Figure 6:
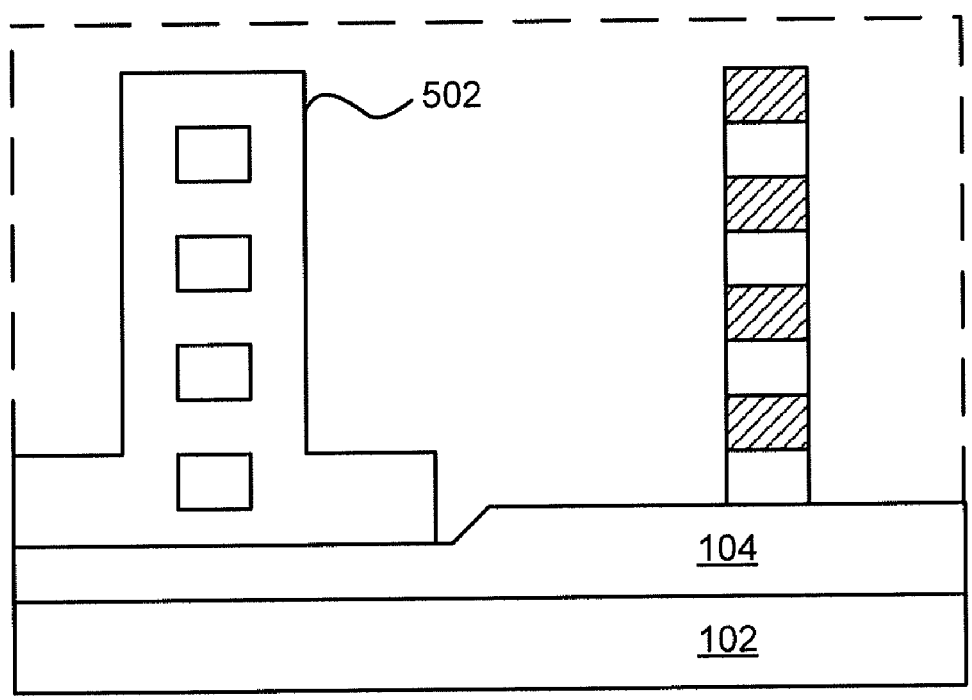
FIG. 6 is a cross sectional view showing a first group of nanowires and a second layered column.

FIG. 6 shows how the second layered column 204 is exposed by removing the second mask layer 302 and the third mask layer 502 over the second layered column 204. These mask layers may be removed using a dry etch.

Figure 7A:
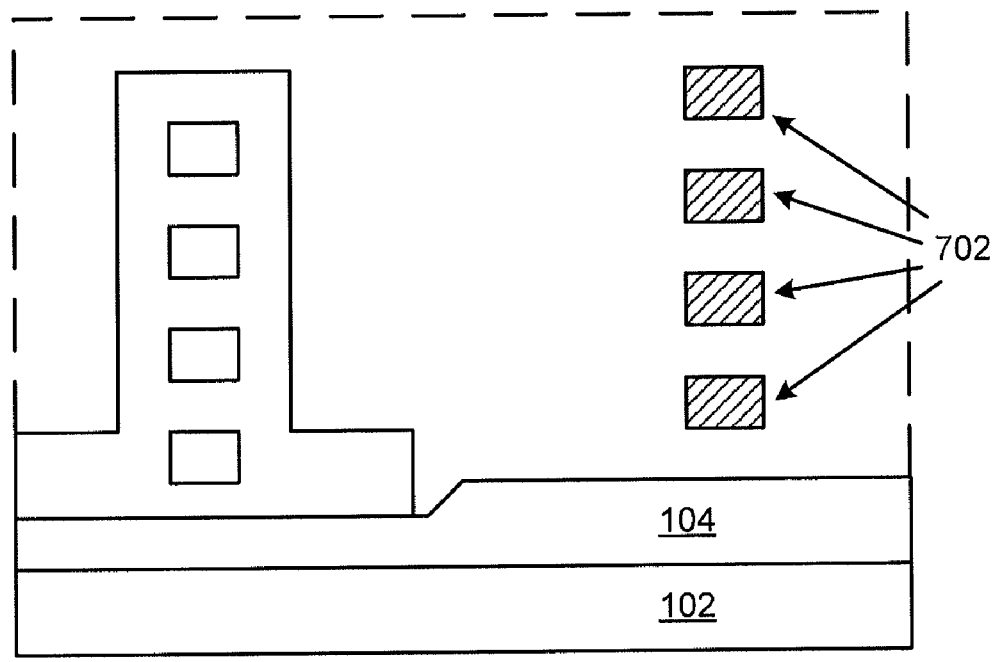
FIG. 7A is a cross sectional view showing a second group of nanowires.

FIG. 7A shows how the second group of nanowires 702 is formed. In this embodiment, the Si 106 was selectively removed from the second layered column 204, leaving only the second group of nanowires 702, that are made of Si—Ge 108. Again, because this is a cross sectional view, the second group of nanowires does not appear to be supported. However, the nanowires are attached to the remaining sections of the layered semiconductor structure 100 at the ends of the nanowires.

Figure 7B:
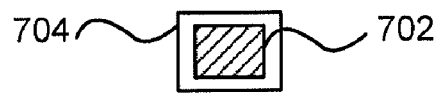
FIG. 7B is a cross sectional view of a nanowire having a core/shell structure.

In some embodiments, the second group of nanowires 702 may be rounded. This rounding may be accomplished using a $H_2$ bake (anneal) of through oxidation. Because the rounding step of the second group of nanowire is performed separately from the rounding step of the first group of nanowires, one can use a different type of rounding or different amounts of rounding for the first group of nanowires and the second group of nanowires. Additionally, a core/shell structure may be formed on the second group of nanowires 702. FIG. 7B shows a nanowire 702 that is enveloped by a layer of Si 802. This Si layer can help improve the interface properties of the final device by acting as a buffer between the SiGe core and the gate dielectric.

Figure 8:
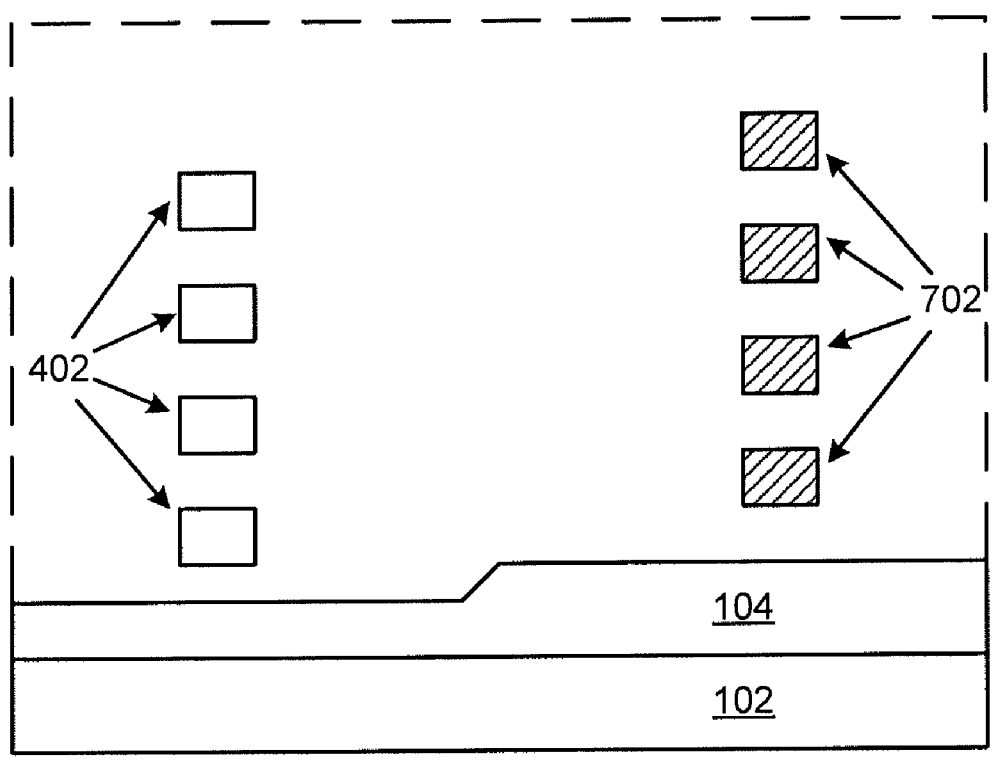
FIG. 8 is a cross sectional view showing two groups of exposed nanowires.

FIG. 8 shows how the first group of nanowires is exposed by removing the third hardmask layer 502. This layer may be removed using a dry etch.

Figure 9A:
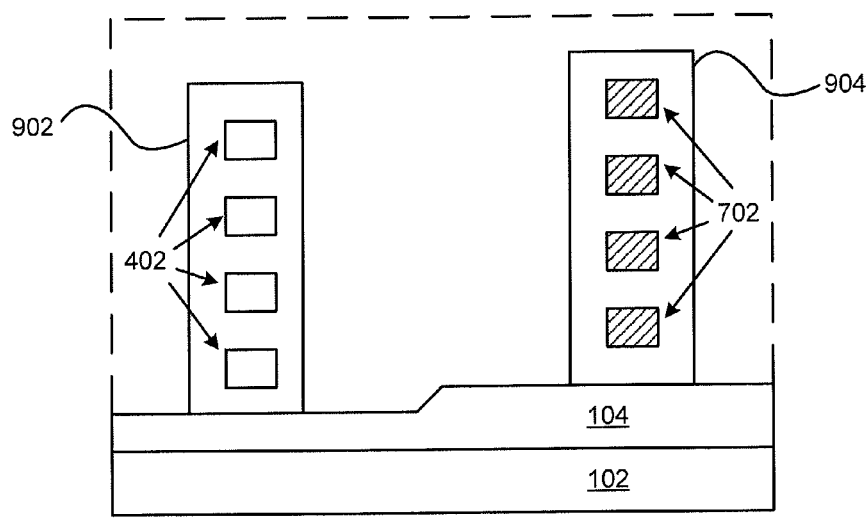
FIG. 9A is a cross sectional view showing a gate around the first group of nanowires and a gate around the second group of nanowires. The view is depicted by reference 206 in FIG. 2B.
Figures 9B, 9C:
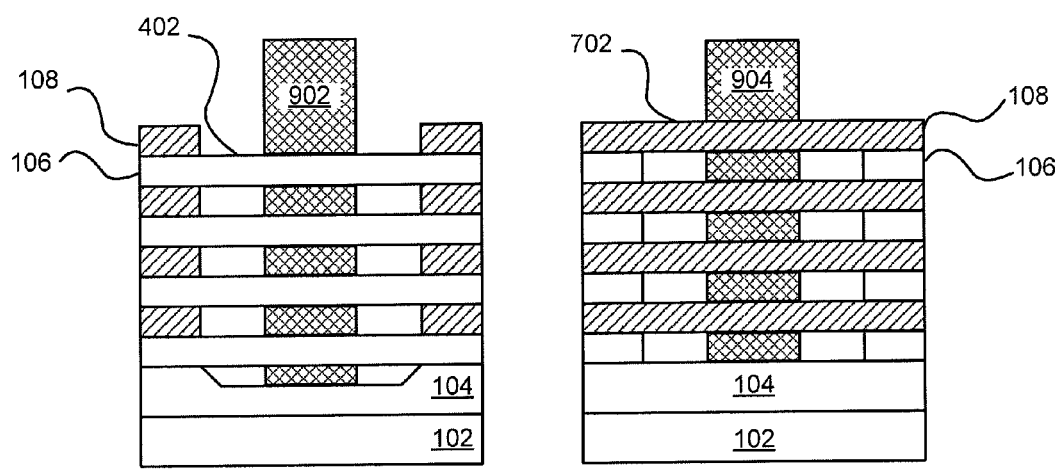
FIG. 9B is a cross sectional view of the first gate, as depicted by reference 208 in FIG. 2B.
FIG. 9C is a cross sectional view of the second gate, as depicted by reference 210 in FIG. 2B.

FIG. 9A shows a first gate 902 that is wrapped around the first group of nanowires 402 and a second gate 904 wrapped around the second group of nanowires 702. Although not shown in FIG. 9A, an insulator surrounds the first group of nanowires 402 and the second group of nanowires 702. $SiO_2$ can be used for this insulator as well as a HiK material. Ideally, in some embodiments, the insulator may be uniformly deposited (conformal) around the Nanowire so that the thickness is the same on all sides of the nanowire. One method to achieve uniform deposition is to use ALD (Atomic Layer Deposition). Furthermore, a metal gate may be used in conjunction with the HiK material. The metal gate may be deposited on the HiK using a conformal deposition process such as ALD. Referring to FIG. 9B, the first gate does not extend the entire length of the first group of nanowires 402. FIG. 9B is a cross section of the structure as seen from line 208 in FIG. 2B. The first group of nanowires has three distinct contacts, one on the left, one on the right, and the gate 902 in the center. These three contacts make the source, drain, and gate 902 of a nanowire FET. In this embodiment, the first group of nanowires 402 and the first gate 902 forms an nFET device. In some embodiments, a device made of Si may be better suited for an nFET device because of the better interface and higher mobility of electrons in Si. In this embodiment, the second group of nanowires 702 and the second gate 904 form a pFET device. In some embodiments, a device made of Si—Ge may be better suited for a pFET device because of the higher mobility of holes in Si-GE. One advantage of the dual-channel nanowire FET device shown in FIG. 9A is that both nFET and pFET devices may be integrated onto a single substrate. This may allow CMOS devices to be smaller and have better performance, and may reduce the time and/or cost of fabricating or integrating the devices.

The nanowires of FIG. 9A are interdigitated because they are formed from alternating layers of semiconductor on the same substrate structure. Therefore, it is possible to easily vary the number of nanowires that are stacked using the same basic methods. Additionally, one can vary the thickness of different layers to affect the diameter, or cross sectional area, of different nanowires within the same nanowire FET device. Compared to FinFETs, dual-channel nanowire FETs have an advantage that they are less complicated to integrate. Also, the likelihood of defectivity is lower because the thickness of the Si—Ge nanowires is below the critical thickness.

In some embodiments, the first group of nanowires may be made of a III-V material and can make an nFET device. The second group of nanowires may be made of germanium (Ge) and can make a pFET device. The combination of a III-V material and Ge has the advantage of allowing good mobility for the nFET using the III-V material and good mobility for the pFET using Ge. Also this combination would work well because III-V materials are commonly grown on Ge because of the low lattice mismatch between these materials. If the III-V and Ge combination is used, one may start with a GeOI wafer and grow alternating layers above the Ge. Although some of the processes may change compared to the Si—SiGe combination, the overall process of making a dual-channel FET device using III-V and Ge is basically the same as that used for a dual-channel FET device using Si and Si—Ge.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 10:
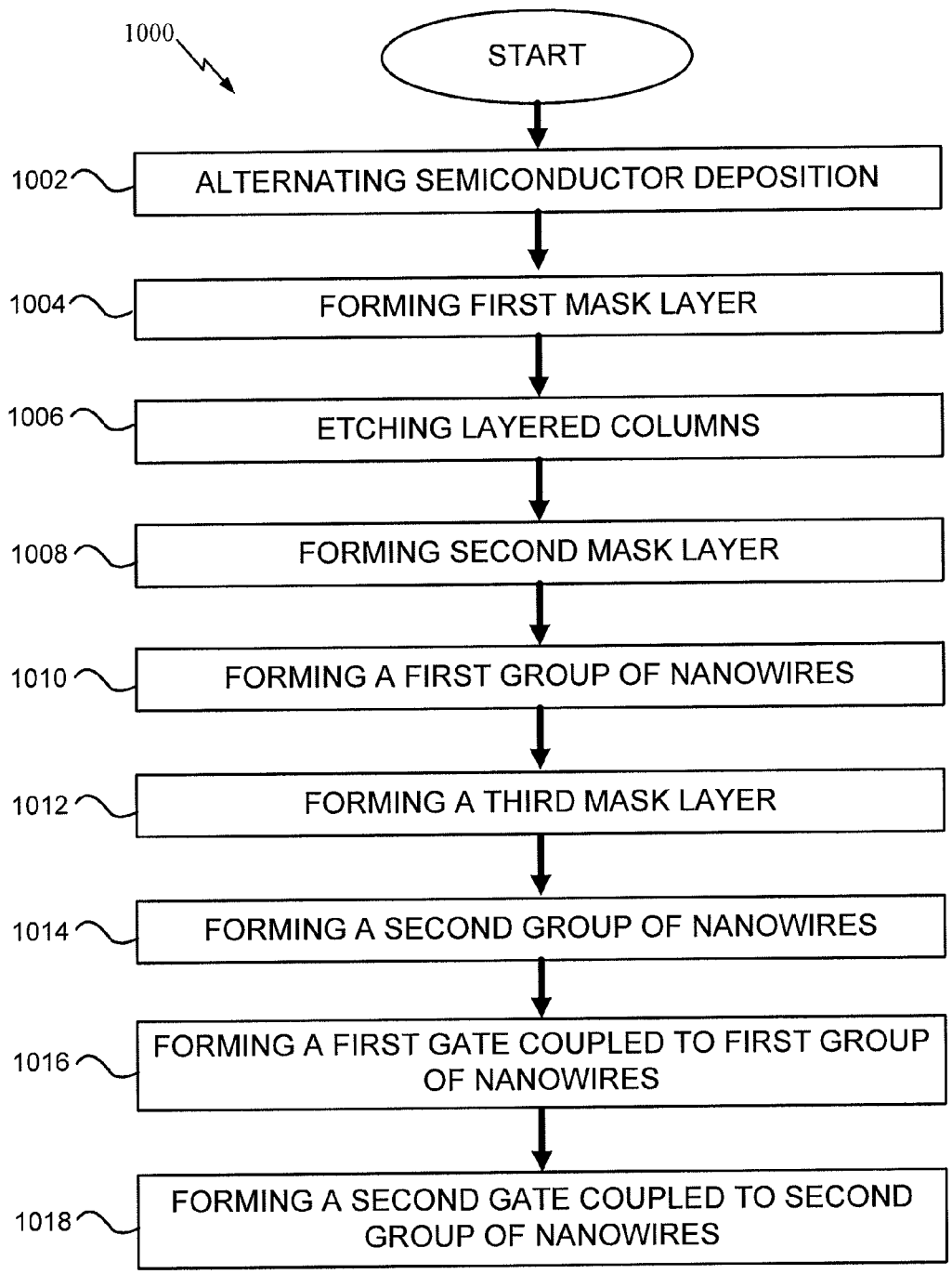
FIG. 10 is a flow chart showing one embodiment of the method used to fabricate a dual-channel FET device.

FIG. 10 illustrates one embodiment of a method 1000 for fabricating a dual-channel nanowire FET device. In one embodiment, the method 1000 starts at step 1002 with alternating semiconductor deposition to create a semiconductor structure 100. This step may include depositing alternating layers of Si and Si—Ge using epitaxy on a Si substrate with a BOX layer. This type of structure is sometimes referred to a silicon on insulator (SOI) structure.

Method 1000 continues to step 1004 of forming a first mask layer. This step defines the area to be etched around the columns 202 and 204, and is element 110 in FIG. 1. Step 1006 continues to the step of etching the layered columns. This step results in the structure depicted in FIGS. 2A and 2B. The layered columns are sometimes referred to as fin-like structures. The etching in step 1006 may be performed using a dry etch.

Method 1000 continues to step 1008, forming a second mask layer 302 as shown in FIG. 3. The method continues to step 1010, which is the step of forming a first type of nanowire. This step is accomplished by selectively removing, or etching, the Si—Ge layer 108, for example. What is left is the nanowires 402 shown in FIG. 4A. In some embodiments, this step further includes rounding the first group of nanowires.

Method 1000 continues to step 1012 of forming a third mask layer 502. This layer protects the first group of nanowires 402 while the second group of nanowires is formed. The method continues to step 1014 of forming the second group of nanowires. This step includes removing masks around the second layered column 204 and selectively removing the Si, for example. What is left is the second group of nanowires 702 shown in FIG. 7A. In some embodiments, this step may include rounding the second group of nanowires 702. In some embodiments, this step may further include the step of depositing a semiconductor on the second group of nanowires 702. For example, Si may be epitaxially deposited on the second group of nanowires 702 as shown in FIG. 7B.

Method 1000 continues to step 1016 of forming a first gate 902 coupled to the first group of nanowires 402, as shown in FIG. 9B. This step may include depositing a HiK material and a metal gate material using an ALD process, so as to create a conformal coating. Additionally, a layer of Si may be deposited on the metal gate using a CVD process. Step 1018 includes forming a second gate 904 coupled to the second group of nanowires 702, as shown in FIG. 9C.

Figure 11:
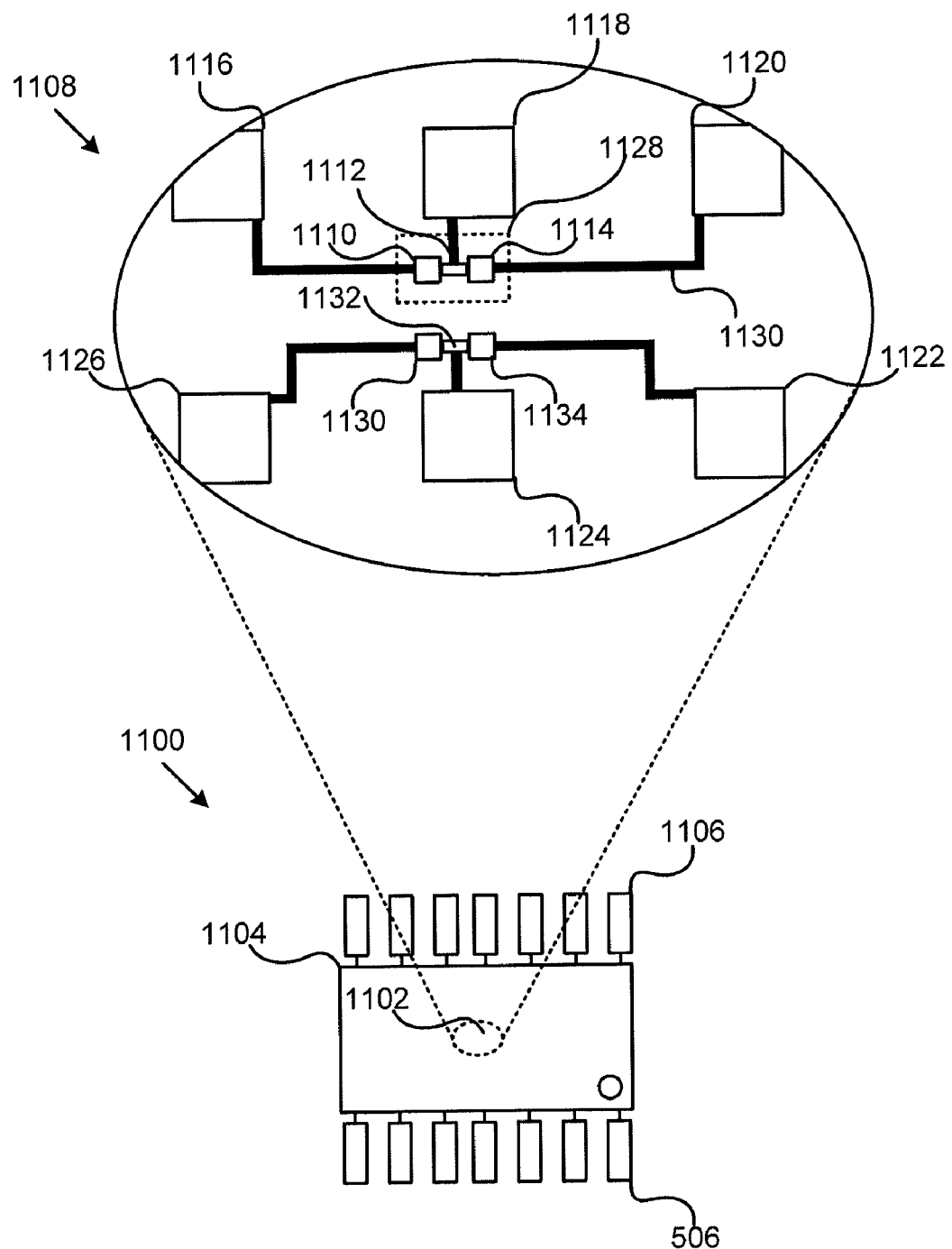
FIG. 11 is a schematic block diagram showing an integrated circuit (IC) device in a package.

Turning to FIG. 11, a schematic diagram of an Integrated Circuit (IC) device 1100 is shown. The chip package 1104 houses the transistors that are inside at position 1102. The package has interface pins 1106 that allow the IC to be electrically coupled to other circuitry. The pins may be made of metal such as nickel or copper. The blowout 1108 shows a nanowire FET 1128 inside the chip package 1104. Nanowire FET 1128, which is made of a first group of nanowires, comprises a source contact 1110, a gate contact 1112, and a drain contact 1114. Each of these electrodes 1110, 1112, 1114, may then be connected through traces 1130 to other parts of the integrated circuit 1116, 1118, and 1120. The second group of nanowires may form a second nanowire FET shown by source 1130, gate 1132, and drain 1134. The second group of nanowires may then be connected using traces 130 to other parts of the circuit 1122, 1124, and 1126. The other parts of the circuit 1116, 1118, 1120, 1122, 1124, and 1126 may also be connected to package pins 1106.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A method of fabricating a nanowire FET (metal oxide semiconductor field effect transistor) device, the method comprising:
   depositing, in at least two alternating layers, a first semiconductor material and a second semiconductor material to form a semiconductor structure;
   etching a first layered column and a second layered column in the semiconductor structure;
   forming a first group of nanowires, where the first group of nanowires comprises the first semiconductor material from the first layered column, and where a channel region in the first group of nanowires consists of the first semiconductor material;
   forming a second group of nanowires, where the second group of nanowires comprises the second semiconductor material from the second layered column, and where a channel region in the second group of nanowires consists of the second semiconductor material and the second semiconductor material is different than the first semiconductor material;

depositing a first gate coupled to the first group of nanowires; and depositing a second gate coupled to the second group of nanowires.

2. The method of claim 1, where etching the first and second layered columns comprises:

depositing a first mask layer on the semiconductor structure, where the first mask layer comprises a pattern for the first and second layered columns; and etching the semiconductor structure that is not masked by the first mask layer.

3. The method of claim 1, where forming the first group of nanowires comprises:

forming a second mask layer on the second layered column;

etching the second semiconductor material from the first layered column; and removing the second mask layer.

4. The method of claim 1, where forming the second group of nanowires comprises:

forming a third mask layer on the first group of nanowires;

etching the first semiconductor material from the second layered column; and removing the third mask layer.

5. The method of claim 1, where the first semiconductor material is silicon (Si) and the second material is silicon-germanium (Si—Ge).

6. The method of claim 1, where the first semiconductor material is a III-V material and the second semiconductor material is germanium (Ge).

7. The method of claim 1, further comprising etching an insulator below the first layered column.

8. The method of claim 7, further comprising etching the insulator below the second layered column.

9. The method of claim 1, further comprising rounding the first group of nanowires.

10. The method of claim 9, where rounding the first group of nanowires is accomplished using a hydrogen bake.

11. The method of claim 9, where rounding the first group of nanowires is accomplished using oxidation.

12. The method of claim 1, further comprising rounding the second group of nanowires.

13. The method of claim 12, where rounding the second group of nanowires is accomplished using a hydrogen bake.

14. The method of claim 12, where rounding the second group of nanowires is accomplished using oxidation.

15. The method of claim 1, where forming a second group of nanowires comprises forming a third semiconductor layer coupled to the second semiconductor material.

* * * * *

UNITED STATES PATENT AND TRADEMARK OFFICE
CERTIFICATE OF CORRECTION

PATENT NO. : 8,183,104 B2  
APPLICATION NO. : 12/831839  
DATED : May 22, 2012  
INVENTOR(S) : Christopher Hobbs Page 1 of 1

It is certified that error appears in the above-identified patent and that said Letters Patent is hereby corrected as shown below:

Title page item 73 to add Assignee, Sematech, Inc., 2706 Montopolis Drive, Austin, TX 78741

Signed and Sealed this  
Tenth Day of July, 2012

David J. Kappos  
*Director of the United States Patent and Trademark Office*